(12) United States Patent  (10) Patent No.: US 7,199,308 B2
Ohsaka  (45) Date of Patent: Apr. 3, 2007

(54) MULTI-LAYERED PRINTED WIRING BOARD

(75) Inventor: Tohru Ohsaka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 253 days.

(21) Appl. No.: 10/949,290

(22) Filed: Sep. 27, 2004

(65) Prior Publication Data

US 2005/0039947 A1 Feb. 24, 2005

Related U.S. Application Data

(62) Division of application No. 10/046,163, filed on Jan. 16, 2002, now Pat. No. 6,800,814.

(30) Foreign Application Priority Data

Jan. 17, 2001 (JP) ............................. 2001-009475
Jan. 11, 2002 (JP) ............................. 2002-004632

(51) Int. Cl.
H01R 12/04 (2006.01)
H05K 1/11 (2006.01)

(52) U.S. Cl. ...................................... 174/261; 361/794
(58) Field of Classification Search ................ 361/800, 361/816, 818, 780, 794; 174/255, 260, 261
See application file for complete search history.

(56) References Cited

U.S. PATENT DOCUMENTS

| | | | |
|---|---|---|---|
| 5,315,069 A | 5/1994 | Gebara | 174/250 |
| 5,586,011 A | 12/1996 | Alexander | 361/818 |
| 6,028,489 A | 2/2000 | Juang et al. | 331/46 |
| 6,081,026 A | 6/2000 | Wang et al. | 257/700 |
| 6,084,779 A | 7/2000 | Fang | 361/763 |
| 6,172,305 B1 * | 1/2001 | Tanahashi | 174/255 |
| 6,495,770 B2 * | 12/2002 | Li et al. | 174/255 |
| 6,777,620 B1 * | 8/2004 | Abe | 174/255 |
| 6,800,814 B2 * | 10/2004 | Ohsaka | 174/255 |
| 2003/0053302 A1 * | 3/2003 | Kelly et al. | 361/780 |

FOREIGN PATENT DOCUMENTS

| | | |
|---|---|---|
| JP | 07-321429 | 12/1995 |
| JP | 10-270862 | 10/1998 |

* cited by examiner

Primary Examiner—William H. Mayo, III
Assistant Examiner—Jeremy C. Norris
(74) Attorney, Agent, or Firm—Fitzpatrick, Cella, Harper & Scinto

(57) ABSTRACT

A multi-layered printed wiring board, capable of securing required wiring density even with a decreased number of wiring layers and reducing radiation noises, has at least three wiring layers each at least having at least one power supply line or a ground line, and another kind of line, the wiring layers each having an outer edge. A ground line is formed at the outer edge of at least one of the wiring layers. A basic power supply line is formed inside the ground line. At least one power supply line extends from the basic power supply line. A plurality of electronic parts are mounted on at least one of the wiring layers. The at least one power supply line is wired to mounting positions of the electronic parts via at least one of the wiring layers.

10 Claims, 9 Drawing Sheets

MULTI-LAYERED PRINTED WIRING BOARD

This application is a division of application Ser. No. 10/046,163, filed Jan. 16, 2002 now U.S. Pat. No. 6,800,814.

BACKGROUND OF THE INVENTION

1. Field of the Invention

This invention relates to a multi-layered printed wiring board having a plurality of wiring layers, and more particularly to a multi-layered printed wiring board that is suitably applied to achieve high-density wiring.

2. Description of the Related Art

In recent years, with the advancement of functions of digital equipment, an increasing number of printed wiring boards installed on digital equipment have been equipped with a great number of multi-pin packaged semiconductor devices such as the BGA (Ball Grid Array). Such multi-pin packaged semiconductor devices include integrated circuits having 500 pins or more. The wiring density of such printed wiring boards has been raised with the increase in the number of pins. This necessitates increasing the number of wiring layers of printed wiring boards, and if a multi-layered printed wiring board having four layers cannot house all required lines, a multi-layered printed wiring board having six layers or a multi-layered printed wiring board having eight layers is used.

Japanese Laid-open Patent Publication (Kokai) No. 10-270862 discloses an example of conventional multi-layered printed wiring boards (first prior art). According to this prior art, a plurality of circuit elements are mounted on the multi-layered printed wiring board, and a ground layer, a signal layer, and a power supply layer providing the circuit elements with power supply voltages are-laminated one upon another via respective insulating materials. The respective circuit elements are classified into a plurality of groups according to the operating speed, and regions for mounting the circuit elements on the multi-layered printed wiring board are determined according to the groups. In the power supply layer, power supply lines are formed according to the groups, and a power line, which separates the power supply lines from one another against high frequencies, connects between the power supply lines belonging to different groups. In this connection, the multi-layered printed wiring board must be provided with a ground-only layer comprised only of ground lines and a power supply-only layer comprised only of power supply lines in order to reduce radiation noises.

Further, Japanese Laid-open Patent Publication (Kokai) No. 7-321429 discloses an example of conventional double-layered printed wiring boards (second prior art). In the printed wiring board according to this prior art, ground lines and power supply lines are provided in the form of a grid in each of the wiring layers such that they extend in parallel and are alternately arranged, and the wiring layers are arranged such that the lines of a first wiring layer and those of a second layer vertically intersect each other, and the ground lines and the power supply lines in the respective wiring layers are connected together via through holes. This arrangement enables a solid ground and reduces radiation noises.

The above described prior arts, however, have the following problems:

The increase in the number of layers as in the first prior art to accommodate all required lines easily realizes high-density wiring, but increases the time and cost required for manufacturing the printed wiring board.

Providing ground lines and power supply lines in the form of a grid on each of the wiring layers as in the second prior art reduces radiation noises, but imposes a lot of restrictions on a space for wiring signal lines and makes it difficult to achieve high-density wiring.

SUMMARY OF THE INVENTION

It is therefore an object of the present invention to provide a multi-layered printed wiring board that is capable of securing required wiring density even with a decreased number of wiring layers and reducing radiation noises.

To attain the above object, a first aspect of the present invention provides a multi-layered printed wiring board having at least three wiring layers each at least having at least one power supply line or a ground line, and another kind of line, said wiring layers each having an outer edge, comprising the ground line formed at the outer edge of at least one of the wiring layers, a basic power supply line formed inside the ground line, the at least one power supply line extending from the basic power supply line, a plurality of electronic parts mounted on at least one of the wiring layers, and wherein the at least one power supply line is wired to mounting positions of the electronic parts via at least one of the wiring layers.

Preferably, the ground line and the basic power supply line are each shaped substantially in a form of annulus and arranged adjacent to each other.

Preferably, the multi-layered printed wiring board according to the first aspect comprises a signal line provided in each of the wiring layers, the signal line connecting between ones of the electrical parts mounted on one of the wiring layers or connecting between ones of the electrical parts mounted on respective different ones of the wiring layers via at least one of the wiring layers, and wherein the power supply line and the signal line are formed inside the basic power supply line.

To attain the above object, a second aspect of the present invention provides a multi-layered printed wiring board having at least three wiring layers each at least having at least one power supply line or a ground line, and another kind of line, said wiring layers each having an outer edge, comprising the ground line formed at the outer edge of at least one of the wiring layers, a plurality of electronic parts mounted on at least one of the wiring layers, the at least one power supply line provided in a predetermined one of the wiring layers at a location inside the ground line, the at least one power supply line being wired to mounting positions of the electronic parts via at least one other one of the wiring layers, a signal line provided in each of the wiring layers, the signal line connecting between ones of the electrical parts mounted on one of the wiring layers or connecting between ones of the electrical parts mounted on respective different ones of the wiring layers via at least one of the wiring layers, and a ground pattern formed over a region other than the power supply line and the signal line and connected to the ground line.

Preferably, in the multi-layered printed wiring board according to the second aspect, the ground line and ground pattern are formed such that the ground line and ground pattern substantially entirely cover the multi-layered printed wiring board when the ground line and ground pattern are projected on one projection plane.

Also preferably, the multi-layered printed wiring board according to the second aspect comprises a basic power supply line formed at the outer edge of at least one of the wiring layers at a location adjacent to and inside the ground line, wherein the power supply line is formed inside the basic power supply line and extends from the basic power supply line via at least one of the wiring layers such that the power supply line is wired to mounting positions of the electrical parts, and the signal line is formed inside the basic power supply line, the signal line connecting between ones of the electrical parts mounted on one of the wiring layers or connecting between ones of the electrical parts mounted on respective different ones of the wiring layers via at least one of the wiring layers.

Preferably, in the multi-layered printed wiring board according to the second aspect, the ground line and the basic power supply line are each shaped substantially in a form of annulus and arranged adjacent to each other.

Preferably, in the multi-layered printed wiring board according to the second aspect, the power supply line and the power supply line are arranged so as not to overlap the power supply line and the signal line in at least one other one of the wiring layers which is adjacent to the at least one of the wiring layers in which the power supply line is formed, when the power supply lines and the signal lines are projected on one projection plane.

To attain the above object, a third aspect of the present invention provides a multi-layered printed wiring board having at least three wiring layers each at least having at least one power supply line or a ground line, and another kind of line, said wiring layers each having an outer edge, the multi-layered printed wiring board comprising a first wiring layer constituting one of the wiring layers, and having ground line formed at the outer edge of the first wiring layer, a first basic power supply line formed adjacent to and inside the ground line, and a first power supply line extending from the first basic power supply line, a second wiring layer constituting one of the wiring layers, and having a ground pattern formed at the outer edge of the second wiring layer, a second basic power supply line for supplying a different voltage from a voltage supplied by the first basic power supply line, the second basic power supply line being formed at a position where the first basic power supply line is projected when the second basic power supply line and the first basic power supply line are projected on one projection plane, and a second power supply line extending from the second basic power supply line, and a plurality of electronic parts mounted on at least one of the wiring layers, wherein the first and second power supply lines extending from the first and second basic power supply lines, respectively are wired to mounting positions of the electronic parts via at least one of the wiring layers.

Preferably, in the multi-layered printed wiring board according to the third aspect, the ground line and ground pattern and the first and second basic power supply lines are each shaped substantially in a form of annulus.

Also preferably, the multi-layered printed wiring board according to the third aspect comprises a signal line provided in each of the wiring layers, the signal line connecting between ones of the electrical parts mounted on one of the wiring layers or connecting between ones of the electrical parts mounted on respective different ones of the wiring layers via at least one of the wiring layers, and a ground pattern formed over a region other than the first and second power supply lines and the signal line and connected to the ground line and ground pattern, and wherein the first and second power supply lines and the signal line are formed inside the first and second basic power supply lines.

To attain the above object, a fourth aspect of the present invention provides a multi-layered printed wiring board having at least three wiring layers each at least having at least one power supply line or a ground line, and another kind of line, said wiring layers each having an outer edge, comprising the ground line formed at the outer edge of at least one of the wiring layers, a first basic power supply line formed adjacent to and inside the ground line, a second basic power supply line formed adjacent to and inside the ground line to supply a different voltage from a voltage supplied by the first basic power supply line, at least two power supply lines extending from respective ones of the first and second basic power supply lines, a plurality of electronic parts mounted on at least one of the wiring layers, and wherein the power supply lines are wired to mounting positions of the electronic parts via at least one of the wiring layers.

Preferably, in the multi-layered printed wiring board according to the fourth aspect, the ground line and the first and second basic power supply lines are shaped substantially in a form of annulus.

Also preferably, the multi-layered printed wiring board according to the fourth aspect comprises a signal line provided in each of the wiring layers, the signal line connecting between ones of the electrical parts mounted on one of the wiring layers or connecting between ones of the electrical parts mounted on respective different ones of the wiring layers via at least one of the wiring layers, and a ground pattern formed over a region other than the power supply lines and the signal line and connected to the ground line, and wherein the power supply lines and the signal line are formed inside the second basic power supply line.

To attain the above object, a fifth aspect of the present invention provides a multi-layered printed wiring board having at least three wiring layers each at least having at least one power supply line or a ground line, and another kind of line, said wiring layers each having an outer edge, comprising the ground line formed at the outer edge of each of the wiring layers, a basic power supply line formed adjacent to and inside the ground line in each of the wiring layers, a plurality of electronic parts mounted on at least one of the wiring layers, the at least one power supply line provided in at least one of the wiring layers at a location inside the basic power supply line, the at least one power supply line extending from the basic power supply line via at least one other one of the wiring layers and wired to mounting positions of the electronic parts, a signal line provided in each of the wiring layers, the signal line connecting between ones of the electrical parts mounted on one of the wiring layers or connecting between ones of the electrical parts mounted on respective different ones of the wiring layers via at least one of the wiring layers, and a ground pattern formed over a region other than the power supply line and the signal line at a location inside the basic power supply line in at least one of the wiring layers, and wherein the ground line in at least one of the wiring layers has a width greater than the ground line in the other wiring layers and connected to the ground pattern via at least one through hole.

In the multi-layered printed wiring board according to the present invention, the ground line is formed at the outer edge of at least one of the wiring layers and the basic power supply line is formed inside the ground line, and the power supply line and the signal line extend from the basic power supply line to mounting positions of the electronic parts via at least one of the wiring layers. This enables higher-density wiring without lowering the wiring density compared with a multi-layered printed wiring board having a ground-only layer and a power supply-only layer.

Further, since the power supply line and the signal line are wired inside the annular basic power supply line in the wiring layer or layers in which they are provided, the degree of freedom in wiring signal lines can be increased.

Further, since the basic power supply line and the ground line are annular in shape and wired adjacent to each other, the capacitive connection between the basic power supply line and the ground line is improved to reduce radiation noises.

Further, in the wiring layer or layers in which the power supply line and the signal line are provided, the ground patterns are formed over a region other than the signal line and the power supply line, and are connected together via through holes. This forms stable grounding and reduces radiation noises.

Further, the ground lines and ground patterns in the respective different wiring layers cover the entire surface of the multi-layered printed wiring board when they are projected on the same projection plane. This forms more stable grounding and reduces radiation noises.

Further, since the signal line and the power supply line are wired at such positions that they do not overlap the signal lines and the power supply lines in adjacent wiring layers when they are projected on the same projection plane. This reduces the effect of cross talk.

Further, since the ground lines in the respective different wiring layers are connected together via through holes, radiation noises can be satisfactorily reduced without providing a ground-only layer.

Therefore, the multi-layered printed wiring board according to the present invention is capable of reducing radiation noises without lowering the wiring density even if the number of wiring layers is decreased.

The above and other objects of the invention will become more apparent from the following detailed description taken in conjunction with the accompanying drawings.

DETAILED DESCRIPTION OF THE PREFERRED EMBODIMENTS

The present invention will now be described in detail with reference to the accompanying drawings showing preferred embodiments thereof.

(First Embodiment)

FIGS. 1A–1D are schematic diagrams showing the construction of a multi-layered printed wiring board according to a first embodiment of the present invention. FIG. 2 is a schematic diagram showing the construction of all layers of the multi-layered printed wiring board according to the first embodiment as viewed from above, and is intended to provide a supplemental explanation of the connection and positional relationship between signal lines.

The multi-layered printed wiring board according to the first embodiment is comprised of a first wiring layer 1, a second wiring layer 2, a third wiring layer 3, and a fourth wiring layer 4, which are shown in FIGS. 1A–1D, respectively. These wiring layers are laminated one upon another in the order mentioned. Each of the wiring layers are comprised of a substrate, and various wiring lines provided on a surface of the substrate. This basic construction applies to other embodiments, described later.

Figure 1A:
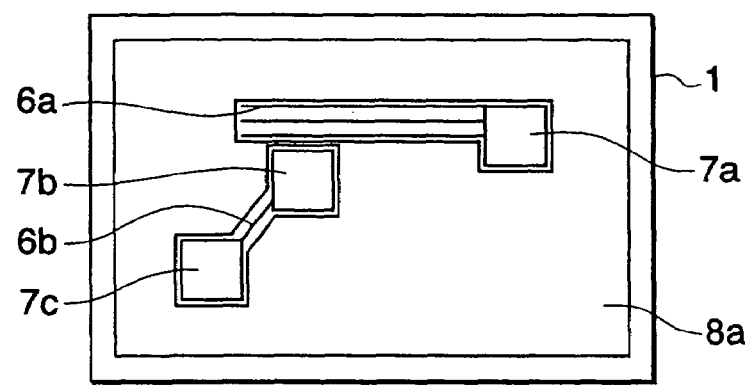
FIGS. 1A–1D are schematic diagrams showing the construction of a multi-layered printed wiring board according to a first embodiment of the present invention.

As shown in FIG. 1A, electronic parts 7a, 7b, 7c are mounted on the first wiring layer 1, and signal lines 6a, 6b and a ground pattern 8a are provided in the first wiring layer 1. The signal line 6a connects between the electronic part 7a in the first wiring layer 1 and an electronic part 7e in the fourth layer 4, appearing in FIG. 1D, via through holes, not illustrated. The signal line 6b connects between the electronic part 7b and the electronic part 7c. In the first wiring layer 1, the ground pattern 8a is formed over a substantially entire area of a major surface of the substrate at regions other than the signal lines such that the minimum required clearances in terms of manufacture are provided between the ground pattern 8a and a power supply line and the signal lines.

Figure 1B:
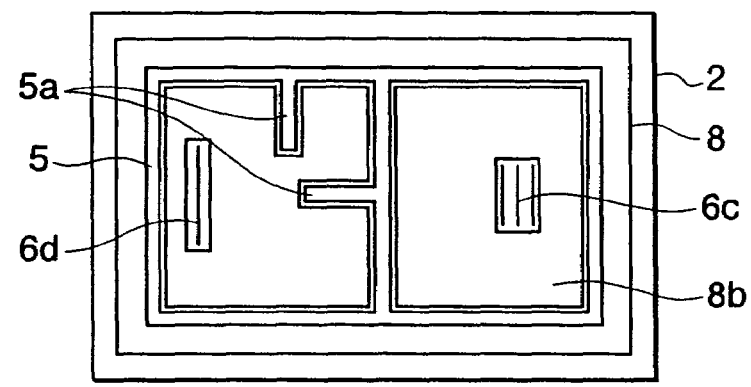

As shown in FIG. 1B, an annular ground line 8 is provided in the second wiring layer 2, and an annular basic power supply line 5 is provided inside the ground line 8. The annular ground line 8 is formed at a region along the outer edge of the substrate, and inside the ground line 8 the annular basic power supply line 5 is formed along the ground line such that the minimum required clearances in terms of manufacture are provided between the two lines 8 and 5. Signal lines 6c, 6d and a ground pattern 8b are provided inside the basic power supply line 5. The signal line 6c connects between the electronic part 7a in the first layer 1 and an electronic part 7d in the fourth layer 4, appearing in FIG. 1D, via through holes, not illustrated. The signal line 6d connects between the electronic part 7c in the first wiring layer 1 and an electronic part 7e in the fourth wiring layer 4, appearing in FIG. 1D, via through holes, not illustrated. A power supply line 5a is provided inside the basic power supply line 5, which connects between the basic power supply line 5 and the electronic part 7b in the first wiring layer 1 via through holes, not illustrated. Inside the basic power supply line 5 in the second wiring layer 2, the ground pattern 8b is formed over a region other than the power supply line and the signal lines such that the minimum required clearances in terms of manufacture are provided between the ground pattern 8*b* and the power supply line and the signal lines.

Figure 1C:
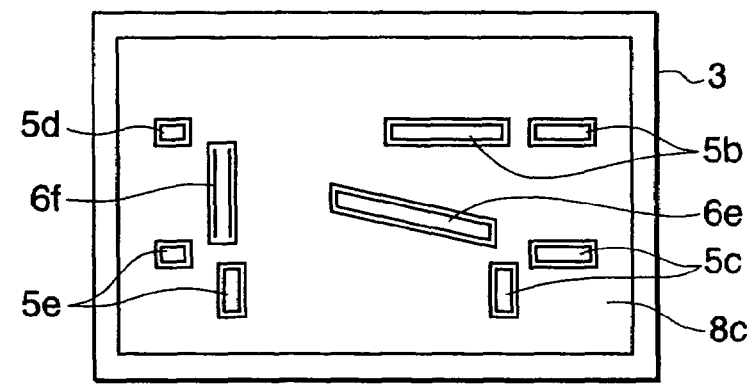

As shown in FIG. 1C, signal lines 6*e*, 6*f*, power supply lines 5*b*, 5*c*, 5*d*, 5*e*, and a ground line 6*c* are provided in the third wiring layer 3. The signal line 6*e* connects between the electronic part 7*b* in the first wiring layer 1 and the electronic part 7*d* in the fourth layer 4, appearing in FIG. 1D, via through holes, not illustrated. The signal line 6*f* connects between the electronic part 7*c* in the first wiring layer 1 and the electronic part 7*e* in the fourth wiring layer 4, appearing in FIG. 1D, via through holes, not illustrated. The power supply line 5*b* connects between the electronic part 7*a* in the first wiring layer 1 and the basic power supply line 5 in the second wiring layer 2 via through holes, not illustrated. The power supply line 5*c* connects between the basic power supply line 5 in the second wiring layer 2 and the electronic part 7*d* in the fourth wiring layer 4, appearing in FIG. 1D, via through holes, not illustrated. The power supply line 5*d* connects between the basic power supply line 5 in the second wiring layer 2 and the electronic part 7*e* in the fourth wiring layer 4 via through holes, not illustrated. The power supply line 5*e* connects between the basic power supply line 5 in the second wiring layer 2 and the electronic part 7*c* in the first wiring layer 1 via through holes, not illustrated. In the third wiring layer 3, the ground pattern 8*c* is formed over a region other than the power supply lines and the signal lines such that the minimum required clearances in terms of manufacture are provided between the ground pattern 8*c* and the power supply lines and the signal lines.

Figure 1D:
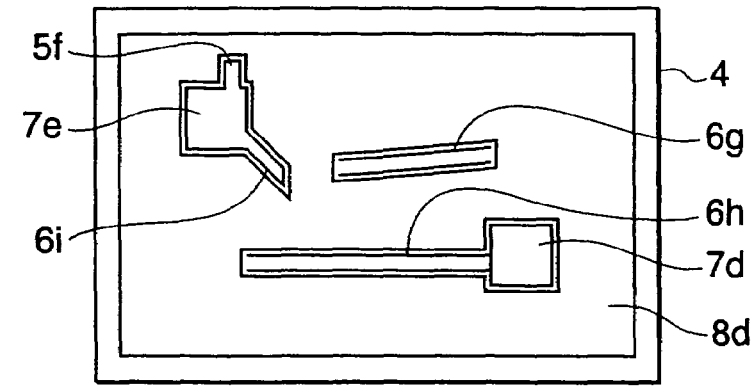
Figure 2:
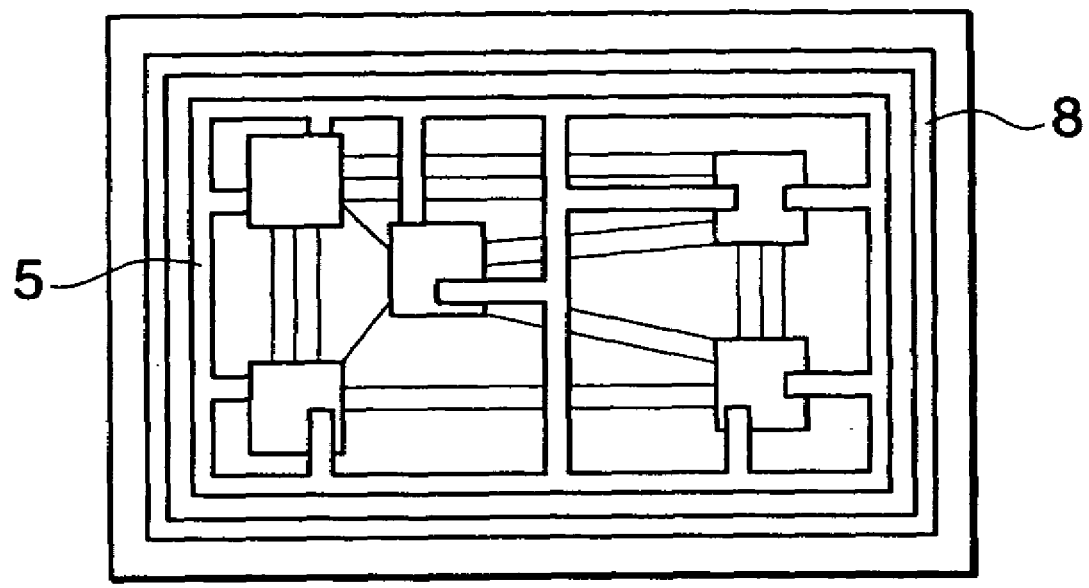
FIG. 2 is a schematic diagram showing the construction of all layers of the printed wiring board according to the first embodiment as fluoroscopically viewed from above.
Figure 3A:
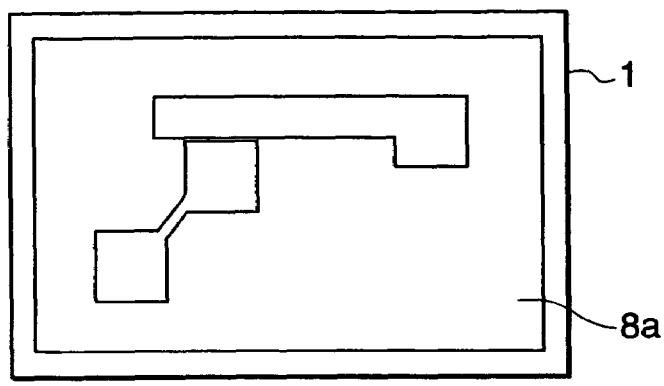
FIGS. 3A–3D are schematic diagrams showing only ground lines on the printed wiring board according to the first embodiment.
Figure 3B:
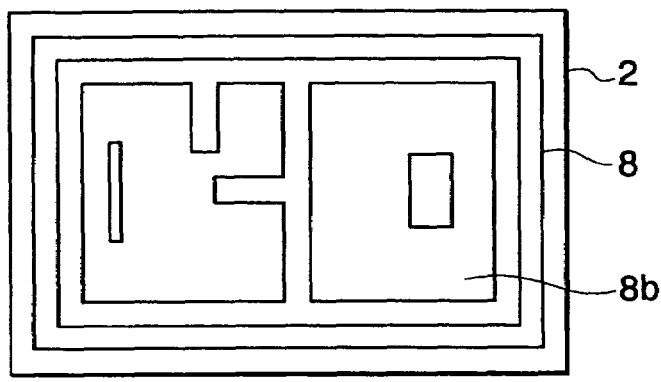
Figure 3C:
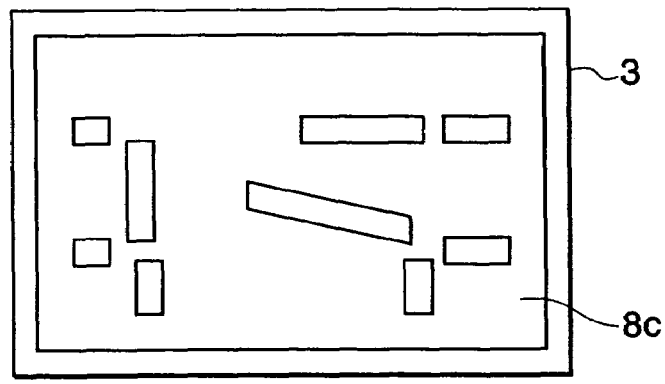
Figure 3D:
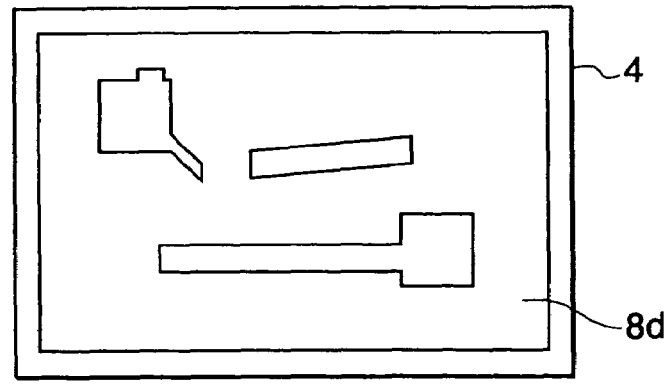

As shown in FIG. 1D, the electronic parts 7*d*, 7*e* are mounted on the fourth wiring layer 4. Signal lines 6*g*, 6*h*, 6*i*, a power supply line 5*f* and a ground pattern 8*d* are also provided in the fourth wiring layer 4. The signal line 6*g* connects between the electronic part 7*a* and the electronic part 7*b* in the first wiring layer 1 via through holes, not illustrated. The signal line 6*h* connects between the electronic part 7*c* in the first wiring layer 1 and the electronic part 7*d* in the fourth wiring layer 4 via through holes, not illustrated. The signal line 6*i* connects between the electronic part 7*e* in the fourth wiring layer 4 and the electronic part 7*b* in the first wiring layer via through holes, not illustrated. In the fourth wiring layer 4, the ground pattern 8*d* is formed over a region other than the power supply lines and the signal lines such that the minimum required clearances in terms of manufacture are provided between the ground pattern 8*d* and the power supply lines and the signal lines.

It should be noted that the ground line 8 and ground patterns 8*a* to 8*d* in the respective wiring layers are connected together via through holes, not illustrated. Therefore, the annular ground line 8 in the second wiring layer 2 is designed to have at least a width that allows formation of the through holes. Likewise, the annular basic power supply line 5 is designed to have a width that allows formation of through holes. As is clear from FIG. 2, all of the signal lines 6*a* to 6*i* in the respective wiring layers are provided inside the power supply line 5 in the second wiring layer 2. The ground patterns 8*a* to 8*d* in the respective wiring layers are omitted from FIG. 2 to make the drawings more understandable.

According to the first embodiment, the power supply wiring extends from the basic power supply line 5 in the second wiring layer 2 up to the third wiring layer 3 and the fourth wiring layer 4 in addition to the second wiring layer 2 so that power can be supplied to the electronic parts mounted on the first wiring layer 1 and the fourth wiring layer 4. The signal wiring is extended over all of the first wiring layer 1, the second wiring layer 2, the third wiring layer 3, and the fourth wiring layer 4. That is, the power supply wiring and the signal wiring can be freely wired on all the wiring layers, and this enables high-density wiring.

It should be noted that, as shown in FIG. 2, the power supply lines 5*a* to 5*f* and the signal lines 6*a* to 6*i* are wired such that the lines on adjacent wiring layers do not overlap each other. This reduces the effect of cross talk caused by adjacent lines to the least possible level. Although the power supply line 5*b* and the signal line 6*a* partially overlap each other in FIG. 2, this does not matter since the power supply line 5*b* is wired in the third wiring layer 3 and the signal line 6*a* is wired in the first wiring layer 1.

Further, since the ground patterns 8*a* to 8*d* in the respective wiring layers cover the regions other than the power supply lines and the signal lines, no limitation is imposed on the route of ground current that is one of sources for generating radiation noises. Thus, the ground current can flow (vertically and horizontally) in the vicinity of the signal lines, and this reduces radiation noises.

Figure 4:
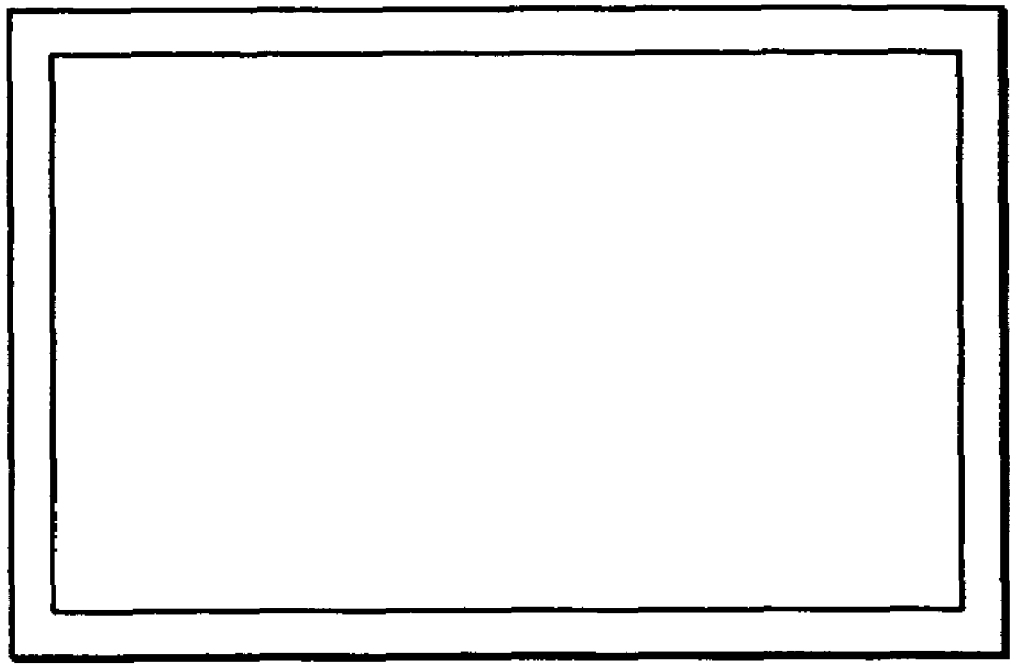
FIG. 4 is a schematic diagram showing only ground lines in each of the layers of the printed wiring board according to the first embodiment as fluoroscopically viewed from above.

FIGS. 3A–3D are schematic diagrams showing only the ground line 8 and ground patterns 8*a* to 8*d* on the multi-layered printed wiring board in FIGS. 1A to 1D, and FIG. 4 is a diagram showing the respective wiring layers of the multi-layered printed wiring board in FIGS. 1A to 1D as fluoroscopically viewed from above. If the ground line 8 and ground patterns 8*a* to 8*d* in the respective wiring layers are projected on the same projection plane as shown in FIG. 4, they cover the entire surface of the multi-layered printed wiring board. This arrangement leads to achievement of more stable grounding.

Although in the first embodiment the ground lines thus cover the entire surface of the multi-layered printed wiring board, it goes without saying that they should not necessarily cover the entire surface insofar as they cover substantially the entire surface, providing substantially the same effects. The ground line 8 may be provided in two or more wiring layers. Still further, although in the first embodiment the ground line 8 and the basic power supply line 5 are annular in shape, this is not limitative, but they may have other shapes insofar as they are substantially annular in shape. Further, although in the first embodiment the multi-layered printed wiring board has four layers, this is not limitative but insofar as they have three or more layers and have no ground-only layer nor power supply-only layer, the object of the present invention can be achieved.

As described above, in the multi-layered printed wiring board according to the first embodiment, the ground line 8 is formed at the outer edge of at least one wiring layer among the four wiring layers, and the basic power supply line 5 is formed inside the ground line 8, and the power supply lines 5*a* to 5*e* and the signal lines 6*a* to 6*i* extend from to the mounting positions of the electronic parts via at least one of the wiring layers. This enables higher-density wiring without lowering the wiring density compared with a multi-layered printed wiring board having six layers including a ground-only layer and a power supply-only layer.

Further, since the power supply lines 5*a* to 5*f* and the signal lines 6*a* to 6*f* in the respective wiring layers are wired inside the annular basic power supply line 5 and the annular basic power supply line 5 is formed at the outer edge of the wiring layer, the inside-wired power supply lines can be arranged with high efficiency and the degree of freedom in wiring the signal lines can be increased.

Further, since the basic power supply line 5 and the ground line 8 are shaped in the annular form and arranged adjacent to each other, the capacitive connection between the basic power supply line 5 and the ground line 8 is improved to reduce radiation noises.

Further, since the ground patterns 8a to 8d in the respective wiring layers are formed over the regions other than the signal lines 6a to 6i and the power supply lines 5a to 5f and are connected together via the through hole, the more stable ground can be formed and radiation noises can be reduced.

Further, the ground line 8 and ground patterns 8a to 8d in the respective wiring layers are formed to cover the entire surface of the multi-layered printed wiring board when they are projected on the same projection plane, more stable grounding can be achieved and radiation noises can be reduced.

Further, since the signal lines 6a to 6i and the power supply lines 5a to 5f in the respective wiring layers are wired such that the signal lines and the power supply lines in the adjacent wiring layers do not overlap each other, the effect of cross talk can be reduced.

Further, since the ground patterns 8a to 8d in the respective wiring layers are connected to the ground line 8 in at least one wiring layer via through holes, the effect of fully suppressing radiation noises can be provided even without a ground-only wiring layer.

As described above, the multi-layered printed wiring board according to the first embodiment is capable of reducing radiation noises without lowering the wiring density even if the number of wiring layers is decreased.

(Second Embodiment)

FIGS. 5A–5D are schematic diagrams showing the construction of a multi-layered printed wiring board according to a second embodiment of the present invention.

The multi-layered printed wiring board according to the second embodiment supplies power to electronic parts 17a, 17b, 17c driven at a first voltage, and electronic parts 17a', 17b' driven at a second voltage different from the first voltage.

The multi-layered printed wiring board according to the second embodiment is comprised of a first wiring layer 11, a second wiring layer 12, a third wiring layer 13, and a fourth wiring layer 14. The electronic parts driven at different two voltages are mounted on the first wiring layer 11 and the fourth wiring layer 14.

Figure 5A:
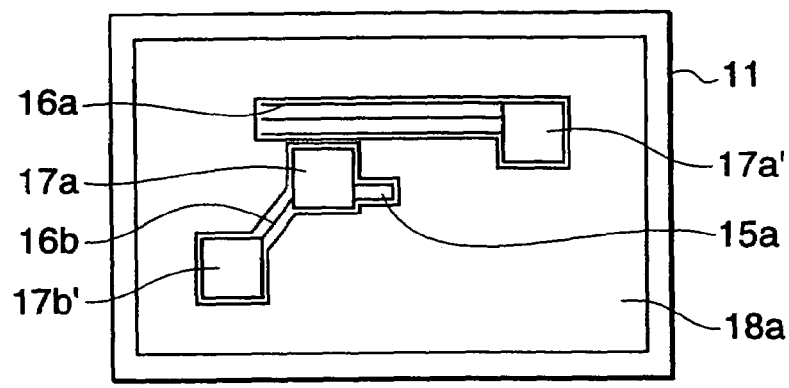
FIGS. 5A–5D are schematic diagrams showing the construction of a multi-layered printed wiring board according to a second embodiment of the present invention.

As shown in FIG. 5A, the electronic parts 17a, 17b, 17c driven at the first voltage and the electronic parts 17a', 17b' driven at the second voltage are mounted on the first wiring layer 11, and signal lines 16a, 16b and a ground pattern 18a are provided in the first wiring layer 11 in a similar arrangement to that in FIG. 1A. The signal line 16a connects between the electronic part 17a and the electronic part 17c in the fourth layer 14, appearing in FIG. 5D, via through holes, not illustrated. The signal line 16b connects between the electronic part 17a and the electronic part 17b'. The power supply line 15a connects between the electronic part 17a and a first basic power supply line 15 in the second wiring layer 12, appearing in FIG. 5B, via through holes, not illustrated. In the first wiring layer 11, the ground pattern 8a is formed over a substantially entire area of a major surface of the substrate at regions other than the power supply line and the signal lines such that the minimum required clearances in terms of manufacture are provided between the ground pattern 18a and the power supply line and the signal lines.

Figure 5B:
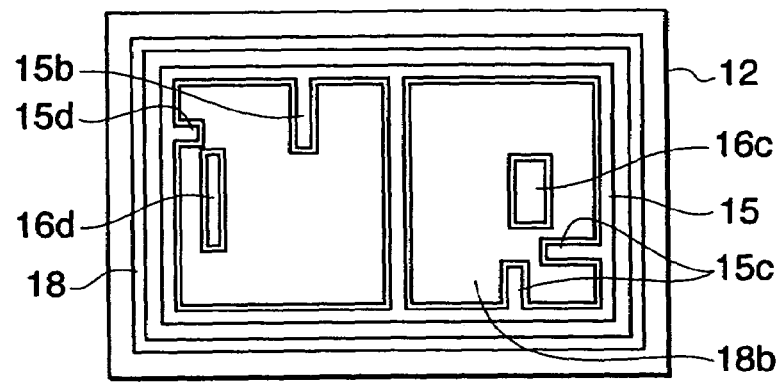

As shown in FIG. 5B, an annular ground line 18 is provided at the outer edge of the second wiring layer 12, and the first annular basic power supply line 15 is provided inside and along the ground line 18. Signal lines 16c, 16d and a ground pattern 18b are provided inside the first basic power supply line 15. The signal line 16c connects between the electronic part 17a' in the first layer 11 and the electronic part 17b in the fourth layer 4 via through holes, not illustrated. The signal line 16d connects between the electronic part 17b' in the first wiring layer 11 and the electronic part 17c in the fourth wiring layer 14 via through holes, not illustrated. A power supply line 15b that connects between the first basic power supply line 15 and the electronic part 17a in the first wiring layer 11 via through holes, not illustrated, a power supply line 15c that connects between the first basic power supply line 15 and the electronic part 17b in the fourth wiring layer 14 via through holes, not illustrated, a power supply line 15d that connects between the first basic power supply line 15 and the electronic part 17c in the fourth wiring layer 14 via through holes, not illustrated are provided inside the first basic power supply line 15. Inside the first basic power supply line 15 in the second wiring layer 12, the ground pattern 18b is formed over a region other than the power supply line and the signal lines such that the minimum required clearances in terms of manufacture are provided between the ground pattern 18b and the power supply line and the signal lines.

Figure 5C:
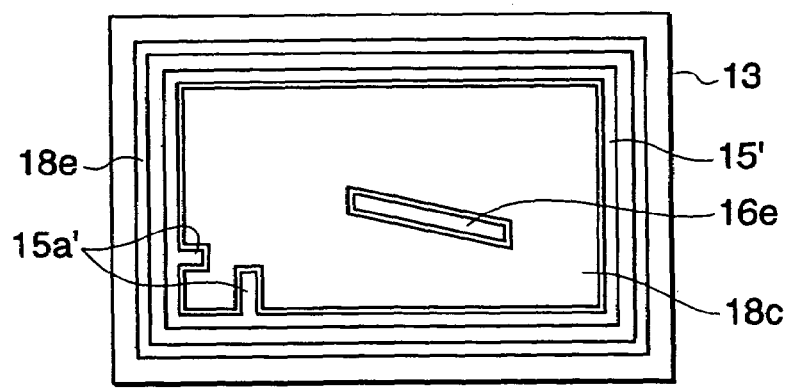
Figure 5D:
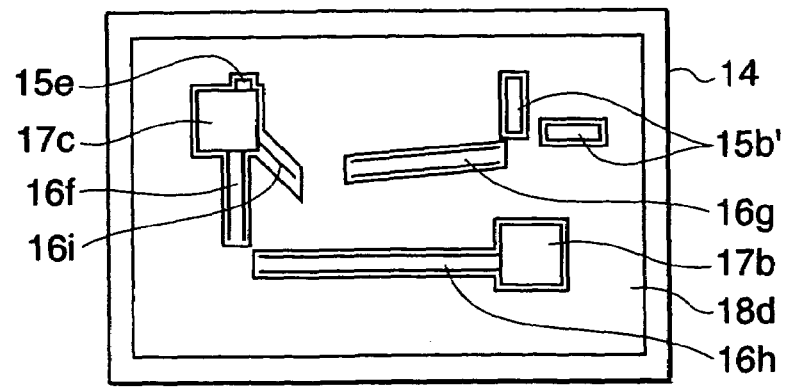

As shown in FIG. 5C, an annular ground line 18e is provided in the third wiring layer 3, and a second annular basic power supply line 15' is provided inside the annular ground line 18e. The ground line 18e and the second basic power supply line 15' are wired at such positions that they overlap the ground line 18 and the first basic power supply line 15, respectively, in the second wiring layer 12. A signal line 16e and a ground pattern 18c are provided inside the second basic power supply line 15'. The signal line 16e connects between the electronic part 17a in the first wiring layer 11 and the electronic part 17b described below in the fourth layer 14 via through holes, not illustrated. A power supply line 15a', which connects between the second basic power supply line 15' and the electronic part 17b' in the first wiring layer 11 via through holes, not illustrated, is provided inside the second basic power supply line 15'. In the third wiring layer 13, the ground pattern 18c is formed over a region other than the power supply line and the signal lines such that the minimum required clearances in terms of manufacture are provided between the ground pattern 18c and the power supply lines and the signal lines.

As shown in FIG. 15D, the electronic parts 17b, 17c driven at the first voltage are mounted on the fourth wiring layer 14. Signal lines 16f, 16g, 16h, 16i, power supply lines 15b', 15e, and a ground pattern 18d are also provided in the fourth wiring layer 14. The signal line 16f connects between the electronic part 17c and the electronic part 17b' in the first wiring layer 11 via through holes, not illustrated. The signal line 16g connects between the electronic part 17a' and the electronic part 17a in the first wiring layer 11 via through holes, not illustrated. The signal line 16h connects between the electronic part 17b in the fourth wiring layer 14 and the electronic part 17b' in the first wiring layer 11 via through holes, not illustrated. The signal line 16i connects between the electronic part 7c in the fourth wiring layer 14 and the electronic part 17a in the first wiring layer 11 via through holes, not illustrated. The power supply line 15b' connects between the second basic power supply line 15' in the third wiring layer 13 and the electronic part 17a' in the first wiring layer 11 via through holes, not illustrated. The power supply line 15e' connects between the first basic power supply line 15 in the second wiring layer 12 and the electronic part 17c in the fourth wiring layer 14 via through holes, not illustrated. In the fourth wiring layer 4, the ground pattern 18d is formed over a region other than the power supply lines and the signal lines such that the minimum required clearances in terms of manufacture are provided between the ground pattern 18d and the power supply lines and the signal lines.

It should be noted that the ground lines 18, 18e and ground patterns 18a to 18d in the respective wiring layers are connected together via through holes, not illustrated. Thus, the ground line 18 in the second wiring layer 12 is designed to have at least a width that allows formation of through holes. Likewise, the first basic power supply lines 15, 15' are designed to have a width that allows formation of through holes.

All of the signal lines 16a to 16i in the respective wiring layers are provided inside the first basic power supply line 15 in the second wiring layer 12 and the second basic power supply line 15' in the third wiring layer 13. The power supply lines 15a, 15b, 15c, 15d, 15e, 15a', 15b' and the signal lines 26a to 26h in the respective wiring layers are wired at such positions that they do not overlap each other when they are projected on the same projection plane from above. This reduces the effect of cross talk caused by adjacent lines to the least possible level.

According to the second embodiment, the multi-layered printed wiring board has the second wiring layer 12 in which the ground line 18 is formed at the outer edge thereof and the basic power supply line 15 is formed adjacent to and inside the ground line 18, and the third wiring layer 13 in which the ground line 18e is provided at the outer edge and the second basic power supply line 15' is formed adjacent to and inside the ground line 18e. The power supply lines 15a, 15b, 15c, 15d, 15e connected to the first basic power supply line 15 supply power to the electronic parts 17a, 17b, 17c driven at the first voltage via predetermined wiring layers. The power supply lines 15a', 15b' connected to the second basic power supply line 15' supply power to the electronic parts 17a', 17b' driven at the second voltage via predetermined wiring layers.

As described above, the multi-layered printed wiring board according to the second embodiment is capable of satisfactorily reducing radiation noises without lowering the wiring density when power of different voltages is supplied to the multi-layered printed board, because the second power supply line 15' is provided at a position where the first power supply line 15 is projected when they are projected on the same projection plane.

(Third Embodiment)

FIGS. 6A–6D are schematic diagrams showing the construction of a multi-layered printed wiring board according to a third embodiment of the present invention. FIG. 7 is a schematic diagram showing the construction of all layers of the multi-layered printed wiring board according to the third embodiment when they are fluoroscopically viewed from above, and is intended to provide a supplemental description of the connection and positional relationship between signal lines.

The multi-layered printed wiring board according to the third embodiment supplies power to electronic parts 27a, 27b, 27c driven at a first voltage, and electronic parts 27a', 27b' driven at a second voltage different from the first voltage.

The multi-layered printed wiring board according to the second embodiment is comprised of a first wiring layer 21, a second wiring layer 22, a third wiring layer 23, and a fourth wiring layer 24. The electronic parts driven at two different voltages are mounted on the first wiring layer 21 and the fourth wiring layer 24.

Figure 6A:
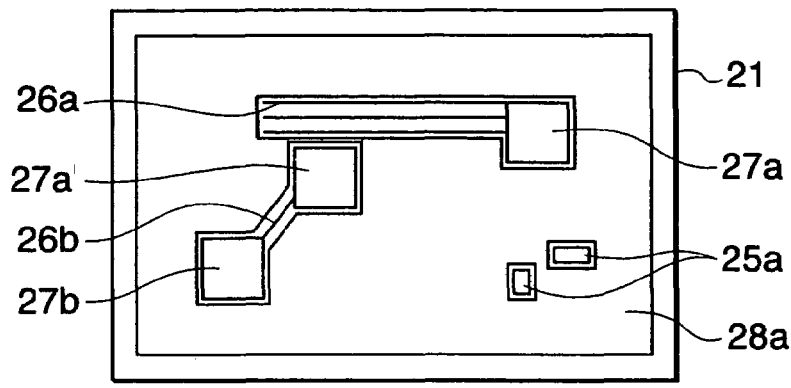
FIGS. 6A–6D are schematic diagrams showing the construction of a multi-layered printed wiring board according to a third embodiment of the present invention.

As shown in FIG. 6A, the electronic parts 27a, 27b, 27c driven at the first voltage and the electronic part 27a' driven at the second voltage are mounted on the first wiring layer 21, and signal lines 26a, 26b and a ground pattern 28a are provided in the first wiring layer 21. The signal line 26a connects between the electronic part 27a in the first wiring layer 21 and the electronic part 27b' in the fourth layer 24, appearing in FIG. 6D, via through holes, not illustrated. The signal line 26b connects between the electronic part 27a, and the electronic part 27b. The power supply line 25a connects between the first basic power supply line 25 in the second wiring layer 22, appearing in FIG. 6B, and the electronic part 27c in the fourth wiring layer 24, appearing in FIG. 6D, via through holes, not illustrated. In the first wiring layer 21, the ground pattern 28a is over a region other than the power supply line and the signal lines such that the minimum required clearances in terms of manufacture are provided between the ground pattern 28a and the power supply line and the signal lines.

Figure 6B:
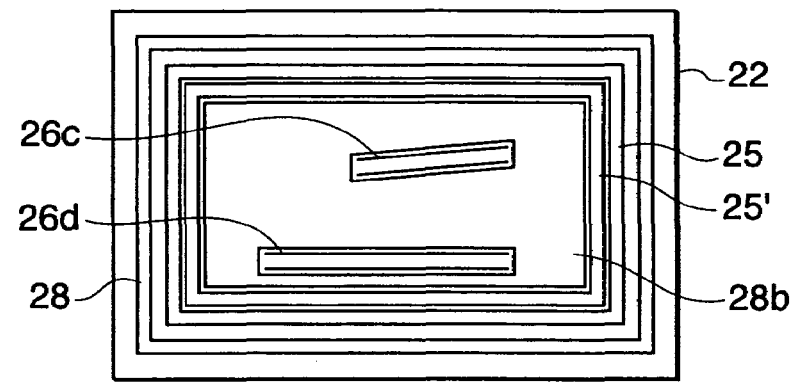
Figure 7:
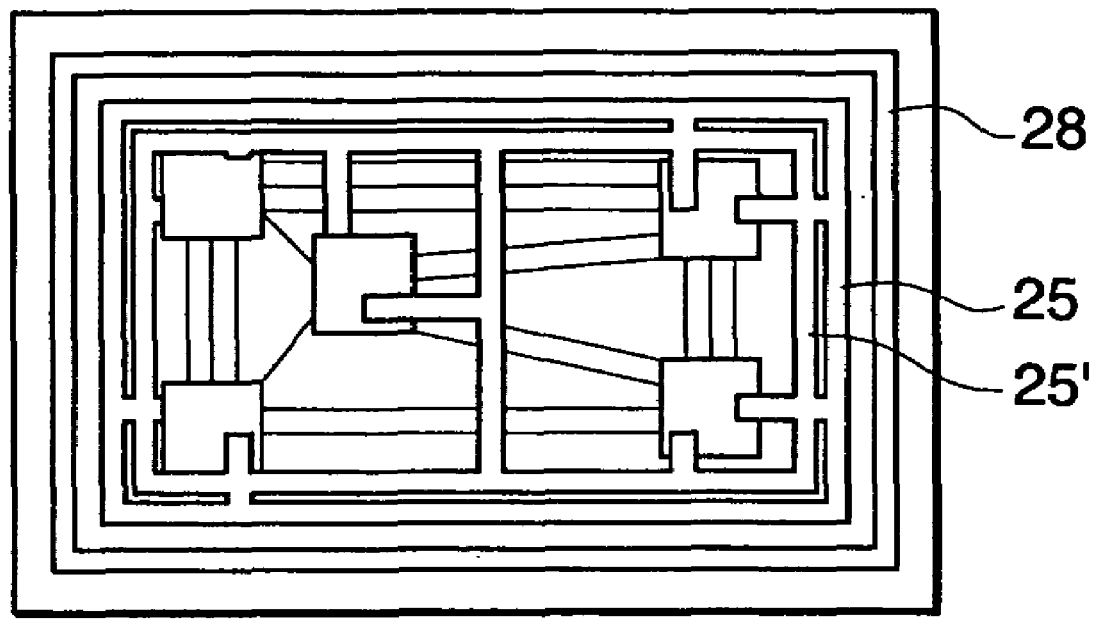
FIG. 7 is a schematic diagram showing the construction of all layers of the printed wiring board according to the third embodiment as viewed from above with layer substrates omitted.

As shown in FIG. 6B, an annular ground line 28 is provided in the second wiring layer 22, the first annular basic power supply line 25 is provided inside the ground line 28, second basic power supply line 25' is provided inside the basic power supply line 25, and signal lines 26c, 26d are provided inside the second basic power supply line 25'. The signal line 26c connects between the electronic part 27a and the electronic part 27a' in the first wiring layer 21 via through holes, not illustrated. The signal line 26d connects between the electronic part 27b in the first wiring layer 21 and the electronic part 2c in the fourth wiring layer 24 via through holes, not illustrated. Inside the second basic power supply line 25' in the second wiring layer 22, the ground pattern 28b is formed over a region other than the power supply lines and the signal lines such that the minimum required clearances in terms of manufacture are provided between the ground pattern 28b and the power supply lines and the signal lines.

Figure 6C:
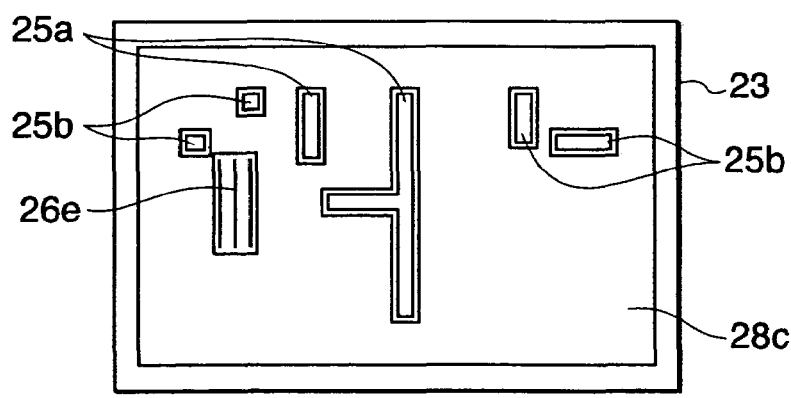

As shown in FIG. 6C, a signal line 26e, power supply lines 25b, 25a', 25b', and a ground pattern 28c are provided in the third wiring layer 23. The signal line 26e connects between the electronic part 27b in the first wiring layer 21 and the electronic part 27b' in the fourth wiring layer 24 via through holes, not illustrated. The power supply line 25b connects between the first basic power supply line 25 in the second wiring layer 22 and the electronic part 27a in the first wiring layer 11 via through holes, not illustrated. The power supply line 25a' connects between the second basic power supply line 25' in the second wiring layer 22 and the electronic part 27a' in the first wiring layer 21 via through holes, not illustrated. The power supply line 25b' connects between the second power supply line 25' in the second wiring layer 22 and the electronic part 27b in the fourth wiring layer 24 via through holes, not illustrated. In the third wiring layer 23, the ground pattern 28c is formed over a region other than the power supply lines and the signal lines such that the minimum required clearances in terms of manufacture are provided between the ground pattern 28c and the power supply lines and the signal lines.

Figure 6D:
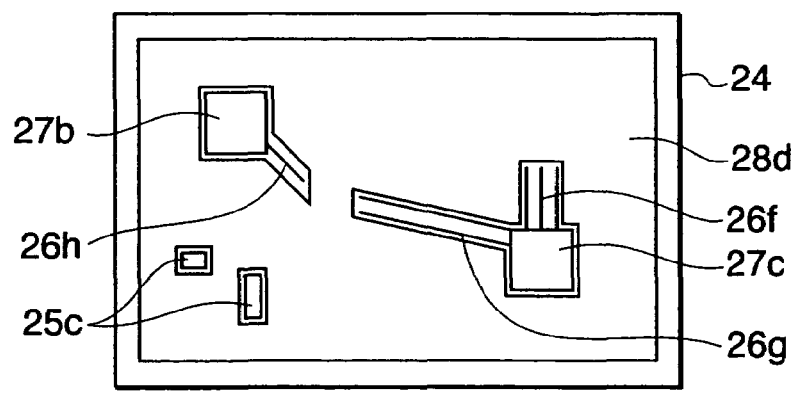

As shown in FIG. 6D, the electronic parts 27c driven at the first voltage and the electronic parts 27b' driven at the second voltage are mounted on the fourth wiring layer 24. Signal lines 26f, 26g, 26h, a power supply line 25c, and a ground pattern 28d are provided in the fourth wiring layer 24. The signal line 26f connects between the electronic part 27c and the electronic part 27a in the first wiring layer 21 via through holes, not illustrated. The signal line 26g connects between the electronic part 27c in the fourth wiring layer 24 and the electronic part 27a' in the first wiring layer 21 via through holes, not illustrated. The signal line 26h connects between the electronic part 27b' in the fourth wiring layer 24 and the electronic part 27a' in the first wiring layer 21 via through holes, not illustrated. The power supply line 25c connects between the first basic power supply line 25 in the second wiring layer 22 and the electronic part 27b in the first wiring layer 21 via through holes, not illustrated. In the fourth wiring layer 24, the ground pattern 28d is formed over a region other than the power supply line and the signal lines such that the minimum required clearances in terms of manufacture are provided between the ground pattern 28d and the power supply line and the signal lines.

It should be noted that the ground line 28 and ground patterns 28a to 28d in the respective wiring layers are connected together via through holes, not illustrated. Thus, the ground line 28 in the second wiring layer 22 is designed to have at least a width that allows formation of through holes. Likewise, the first and second basic power supply lines 25, 25' are designed to have a width that allows formation of through holes.

As shown in FIG. 7, all of the signal lines 26a to 26h in the respective wiring layers are provided inside the second basic power supply line 25' in the second wiring layer 22. The power supply lines 25a, 25b, 25c, 25a', 25b' and the signal lines 26a to 26h in the respective wiring layers are wired at such positions that they do not overlap each other when they are projected on the same projection plane from above. This reduces the effect of cross talk caused by adjacent lines to the least possible level. The ground patterns 28a to 28d are omitted from FIG. 7 in order to make the drawing more understandable.

According to the third embodiment, the second basic power supply line 25' is provided adjacent to and inside the first basic power supply line 25 wired at the outer edge of the second wiring layer 22. The power supply lines 25a, 25b, 25c connected to the first basic power supply line 25 supply power to the electronic parts 27a, 27b, 27c driven at the first voltage via predetermined layers. The power supply lines 25a', 25b' connected to the second basic power supply line 25' supply power to the electronic parts 27a', 27b' driven at the second voltage via predetermined layers.

As described above, the multi-layered printed wiring board according to the third embodiment is capable of achieving the same effects as the first embodiment and also satisfactorily reducing radiation noises without lowering the wiring density when power of different voltages is supplied to the multi-layered printed board, because the second power supply line 25' is provided inside the first power supply line 25.

(Fourth Embodiment)

FIGS. 8A–8D are schematic diagrams showing the construction of a multi-layered printed wiring board according to a fourth embodiment of the present invention. Signal lines, electronic parts, power supply lines, ground lines inside basic power supply lines are omitted from these figures and a description thereof is also omitted herein. FIG. 9 is a schematic sectional view showing a section of the multi-layered printed wiring board according to the fourth embodiment, and is intended to provide a supplementary description of the positional relationship between the ground line at the outer edge and the basic power supply line in the respective wiring layers.

In the multi-layered printed wiring board according to the fourth embodiment, power supply lines that supply different voltages are provided at the outer edge of each of wiring layers (four wiring layers in the fourth embodiment).

The multi-layered printed wiring board according to the fourth embodiment is comprised of a first wiring layer 31, a second wiring layer 32, a third wiring layer 33, and a fourth wiring layer 34.

Figure 8A:
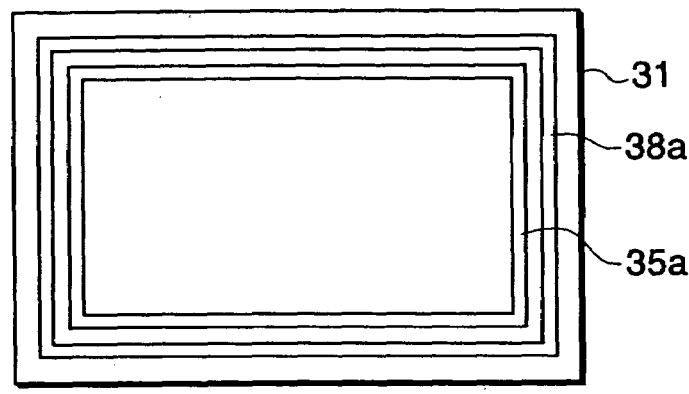
FIGS. 8A–8D are schematic diagrams showing the construction of a multi-layered printed wiring board according to a fourth embodiment of the present invention.
Figure 9:
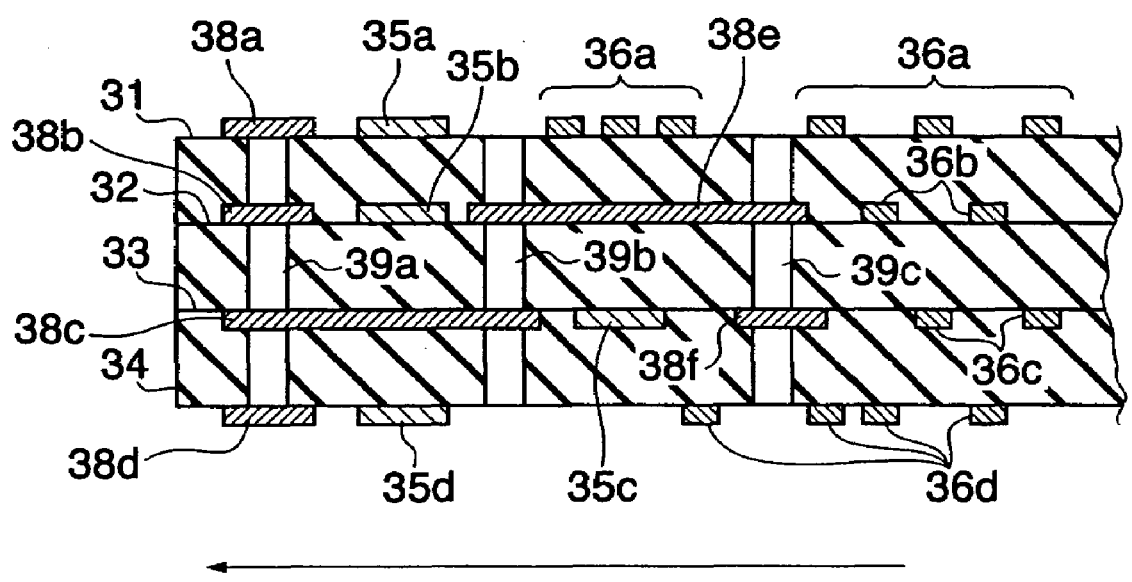
FIG. 9 is a schematic sectional view showing a section of the multi-layered printed wiring board according to the fourth embodiment.

As shown in FIGS. 8A and 9, a ground line 38a is provided at the outer edge of the first wiring layer 31, and a first basic power supply line 35a is provided inside the ground line 38a. A signal line 36a is provided inside the first basic power supply line 35a.

Figure 8B:
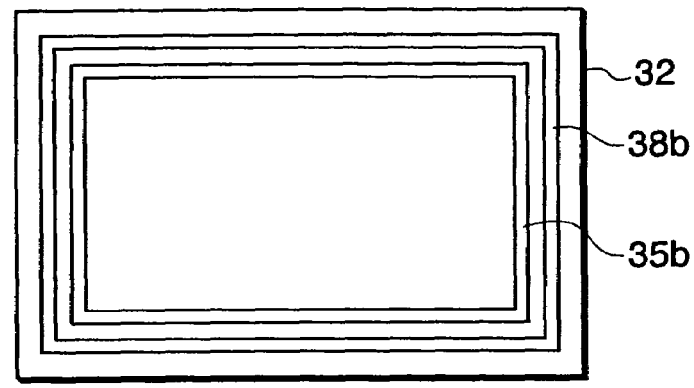

As shown in FIGS. 8B and 9, a ground line 38b, which is connected to the ground line 38a in the first wiring layer 31 via through holes 39a, is provided at the outer edge of the second wiring layer 32, and a second basic power supply line 35b is provided inside the ground line 38b. A ground pattern 38e and a signal line 36b are provided inside the second basic power supply line 35b. The ground line 38b and the second basic power supply line 35b are wired at positions where the ground line 38a and the first basic power supply line 35a are projected when they are projected on the same projection plane.

Figure 8C:
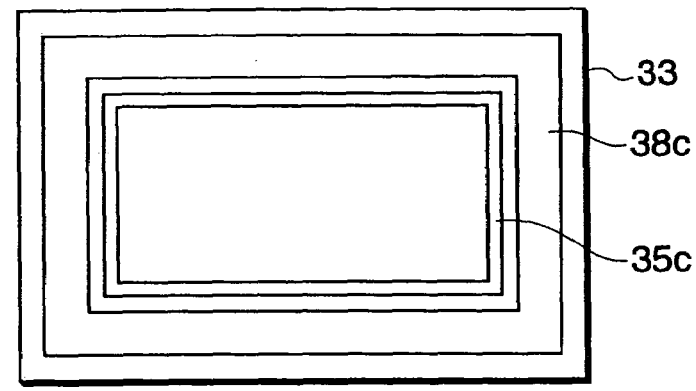

As shown in FIGS. 8C and 9, a ground line 38c, which is connected to the ground line 38b in the second wiring layer 32 via the through holes 39a, is provided at the outer edge of the third wiring layer 33, and a third basic power supply line 35c is provided inside the ground line 38c. A signal line 36c and a ground pattern 38f are provided inside the third basic power supply line 35c. The ground line 38c is wider than the ground lines 38a, 38b, 38d in the other wiring layers. Although the position of the outside of the ground line 38c corresponds to the positions of the outsides of the ground lines in the other wiring layers, the position of the inside of the ground line 38c is located inside the ground lines in the other wiring layers and connected to the ground pattern 38e in the second wiring layer via through holes 39b. The ground pattern 38f is connected to the ground pattern 38e in the second wiring layer 32 via through holes 39c.

Figure 8D:
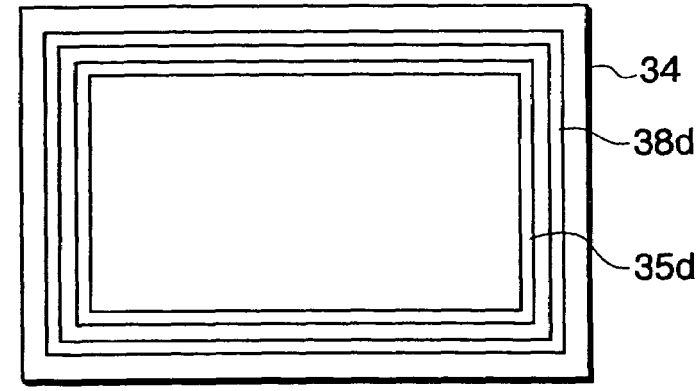

As shown in FIGS. 8D and 9, a ground line 38d, which is connected to the ground line 38c in the third wiring layer 33 via the through holes 39a, is provided at the outer edge of the fourth wiring layer 34, and a fourth basic power supply line 35d is provided inside the ground line 38d. A signal line 36d is provided inside the fourth basic power supply line 35d. The ground line 38d and the fourth basic power supply line 35d are wired at positions where the ground line 38a and the first basic power supply line 35a in the first wiring layer 31 are projected when all of them are projected on the same projection plane.

It should be noted that all of the first to fourth basic power supply lines may supply different voltages, or two or three ones of the first to fourth basic power supply lines may supply the same voltage.

As described above, the multi-layered printed wiring board according to the fourth embodiment is capable of achieving the same effects as the first embodiment and also satisfactorily reducing radiation noises without lowering the wiring density when power of different voltages is supplied to all the wiring layers of the multi-layered printed board, because the basic power supply line in at least one wiring layer (in the fourth embodiment, the basic power supply line 35c in the third wiring layer) is provided inside the basic power supply lines in the other wiring layers, and the widened ground line is provided outside the basic power supply line and connected to the inner ground line.

(Other Embodiments)

1) Although the above described first to fourth embodiments are each implemented as a single multi-layered printed wiring board, there is no intention to limit the invention to this, but the present invention may be applied to a single apparatus (e.g. copying machines, function combined copying machines, various kinds of printers, scanners, facsimile machines, digital cameras, and the like) in which is installed the multi-layered printed wiring board according to the present invention.

2) Although the above described first to fourth embodiments are each implemented as a single multi-layered printed wiring board, there is no intention to limit the invention to this, but the present invention may be applied to a system (e.g. an image formation system, an image reading system, an image communication system, and an imaging system) that is comprised of a plurality of electronic apparatuses (e.g. copying machines, function combined copying machines, various kinds of printers, scanners, facsimiles, digital cameras, and the like) in which is installed the multi-layered printed wiring board according to the present invention.

What is claimed is:

1. A multi-layered printed wiring board having at least three wiring layers, each having an outer edge, comprising:
    a ground line, a ground pattern, at least one power supply line, a basic power supply line, and a signal line;
    said ground line being formed around the outer edge of at least one of said wiring layers;
    said basic power supply line being formed around the inside of said ground line on the at least one of said wiring layers on which said ground line is formed;
    each said power supply line extending inwardly from said basic power supply line; and
    each of said wiring layers having at least two selected from the group consisting of said ground line or said ground pattern, said basic power supply line or said at least one power supply line, and said signal line.

2. A multi-layered printed wiring board according to claim 1, wherein each said power supply line is formed inside said basic power supply line when a said power supply line and said basic power supply line are projected on one projection plane.

3. A multi-layered printed wiring board according to claim 1, wherein said ground line and said basic power supply line are each shaped substantially in a form of an annulus and arranged adjacent to each other.

4. A multi-layered printed wiring board according to claim 3, wherein said power supply line and said signal line are formed inside said basic power supply line when said power supply line, said signal line, and
    said basic power supply line are projected on one projection plane.

5. A multi-layered printed wiring board according to claim 4, wherein said ground line and said ground pattern are formed such that said ground line and said ground pattern substantially entirely cover said multi-layered printed wiring board when said ground line and said ground pattern are projected on one projection plane.

6. A multi-layered printed wiring board according to claim 1, wherein said power supply line and said signal line are arranged so as not to overlap said power supply line and said signal line in at least one other one of said wiring layers which is adjacent to the at least one of said wiring layers on which said signal line is formed, when said power supply line and said signal line are projected on one projection plane.

7. A multi-layered printed wiring board having at least three wiring layers, each having an outer edge, said multi-wiring layered printed wiring board comprising:
    a first wiring layer constituting one of said wiring layers, and having a ground line formed around an outer edge of said first wiring layer, a first basic power supply line formed adjacent to and inside said ground line, and a first power supply line extending inwardly from said first basic power supply line;
    a second wiring layer constituting one of said wiring layers, and having a ground pattern formed at the outer edge of said second wiring layer, a second basic power supply line for supplying a different voltage from a voltage supplied by said first basic power supply line, said second basic power supply line being formed at a position where said first basic power supply line is projected when said second basic power supply line and said first basic power supply line are projected on one projection plane, and a second power supply line extending from said second basic power supply line; and
    a signal line;
    each of said wiring layers having said signal line, and at least two selected from the group consisting of said ground line or said ground pattern, said first basic power supply line, said second power supply line, said first power supply line, and said second basic power supply line.

8. A multi-layered printed wiring board according to claim 7, wherein said ground line, said ground pattern, and said first and second basic power supply lines are each shaped substantially in a form of an annulus.

9. A multi-layered printed wiring board according to claim 8, comprising a ground pattern formed over a region other than said first and second power supply lines and said signal line and connected to said ground line and said ground pattern.

10. A multi-layered printed wiring board having at least three wiring layers, each having an outer edge, comprising:
    a ground line formed around an outer edge of at least one of said wiring layers;
    a ground pattern;
    a basic power supply line being formed around the inside of said ground line of at least one of said wiring layers;
    at least one power supply line extending inwardly from said basic power supply line; and
    a signal line;
    each of said wiring layers having at least two selected from the group consisting of said ground line or said ground pattern, said basic power supply line or said at least one power supply line, and said signal line.

* * * * *

UNITED STATES PATENT AND TRADEMARK OFFICE
CERTIFICATE OF CORRECTION

PATENT NO. : 7,199,308 B2  Page 1 of 1
APPLICATION NO. : 10/949290
DATED : April 3, 2007
INVENTOR(S) : Tohru Ohsaka It is certified that error appears in the above-identified patent and that said Letters Patent is hereby corrected as shown below:

COLUMN 1:

Line 35, "are-laminated" should read --are laminated--.

COLUMN 3:

Line 15, "of" should read --of an--; and
Line 19, "power supply" should read --signal--.

COLUMN 5:

Line 26, ". This" should read --,--; and
Line 27, "reduces the effect of cross talk" should read --the effect of cross talk is reduced--.

COLUMN 8:

Line 53, "from to" should read --from--.

COLUMN 9:

Line 9, "the" should read --since the--.

Signed and Sealed this

Sixteenth Day of September, 2008

JON W. DUDAS
*Director of the United States Patent and Trademark Office*